(12) United States Patent
Han et al.

(10) Patent No.: US 11,605,539 B2
(45) Date of Patent: *Mar. 14, 2023

(54) DEFECT CORRECTION ON METAL RESISTS

(71) Applicant: Tokyo Electron Limited, Tokyo (JP)

(72) Inventors: Yun Han, Albany, NY (US); Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/352,437

(22) Filed: Jun. 21, 2021

(65) Prior Publication Data

US 2022/0181153 A1 Jun. 9, 2022

Related U.S. Application Data

(63) Continuation of application No. 17/111,652, filed on Dec. 4, 2020, now Pat. No. 11,094,543.

(51) Int. Cl.
*H01L 21/033* (2006.01)
*H01L 21/311* (2006.01)
*H01L 21/02* (2006.01)

(52) U.S. Cl.
CPC ...... *H01L 21/0337* (2013.01); *H01L 21/0228* (2013.01); *H01L 21/02164* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| 11,094,543 B1 * | 8/2021 | Han ............... H01L 21/31116 |
| 2006/0093925 A1 | 5/2006 | Cheng |
| 2020/0098589 A1 | 3/2020 | Ma et al. |
| 2020/0144061 A1 | 5/2020 | Mignot et al. |

OTHER PUBLICATIONS

Umeda, Toru et al., "Microbridge reduction in negative tone imaging at photoresist point-of-use filtration", SPIE, Advances in Patterning Materials and Processes XXXII, vol. 9425, doi: 10.1117/12.2085710, Mar. 2015,11 pages.

* cited by examiner

*Primary Examiner* — Roberts P Culbert
(74) *Attorney, Agent, or Firm* — Slater Matsil, LLP

(57) ABSTRACT

A method for forming a semiconductor device includes depositing a metal resist layer over a layer to be patterned that is formed over a substrate; patterning the metal resist layer using a lithography process to form a patterned metal resist layer and expose portions of the layer to be patterned; selectively depositing a silicon containing layer over the patterned resist layer by exposing the substrate to a gas mixture comprising a silicon precursor, the silicon containing layer being preferentially deposited over a top surface of the metal resist layer; and performing a surface cleaning process by exposing the layer to be patterned and the patterned metal resist layer covered with the silicon containing layer to a plasma process with an etch chemistry comprising a halogen or hydrogen.

20 Claims, 7 Drawing Sheets

DEFECT CORRECTION ON METAL RESISTS

CROSS-REFERENCE TO RELATED APPLICATIONS

This application is a continuation of U.S. patent application Ser. No. 17/111,652, filed on Dec. 4, 2020, which application is hereby incorporated herein by reference.

TECHNICAL FIELD

The present invention relates generally to semiconductor fabrication, and in particular embodiments, to a defect correction on metal resists.

BACKGROUND

Generally, semiconductor devices, such as integrated circuits (IC's) are fabricated by sequentially depositing and patterning layers of dielectric, conductive, and semiconductor materials over a semiconductor substrate using photolithography and etch to form structures for circuit components and interconnect elements (e.g., transistors, resistors, capacitors, metal lines, contacts, and vias). At each successive technology node, feature sizes are shrunk to roughly double the component packing density. A direct method for printing the higher resolution patterns is to reduce the wavelength of the light source. The 248 nm deep ultraviolet (DUV) radiation source (KrF laser), used to expose critical patterns at the 250 nm and 130 nm nodes, was replaced by the 193 nm ArF laser. The 193 nm optics is further extended to 14 nm and even 10 nm nodes using multiple patterning techniques, but at higher cost and processing complexity associated with the additional masks. At the sub-10 nm regime, DUV may be replaced by the even shorter 13.5 nm wavelength extreme ultraviolet (EUV) technology. While EUV promises high resolution with fewer masks, it has to bring together all the components of a lithography system (radiation source, scanner, mask, and resist), overcoming each component's engineering hurdles. One major issue is that conventional chemically amplified (CA) resists used with DUV may not be able to achieve the required resolution and sensitivity required for the 10-nm node. Metal resists have been suggested as an improvement over CA resists. While metal resist can achieve the required resolution, metal resists bring a unique set of challenges.

SUMMARY

In accordance with an embodiment, a method for forming a semiconductor device includes depositing a metal resist layer over a layer to be patterned that is formed over a substrate; patterning the metal resist layer using a lithography process to form a patterned metal resist layer and expose portions of the layer to be patterned; selectively depositing a silicon containing layer over the patterned resist layer by exposing the substrate to a gas mixture comprising a silicon precursor, the silicon containing layer being preferentially deposited over a top surface of the metal resist layer; and performing a surface cleaning process by exposing the layer to be patterned and the patterned metal resist layer covered with the silicon containing layer to a plasma process with an etch chemistry comprising a halogen or hydrogen.

In accordance with an embodiment, a method for forming a semiconductor device includes depositing a metal resist layer over a layer to be patterned that is disposed over a substrate; patterning the metal resist layer using an extreme ultraviolet (EUV) lithography process to form a patterned resist layer and expose portions of the layer to be patterned, where the patterning leaves a metal residue over one of the exposed portions of the layer to be patterned; covering a top surface of the patterned metal resist layer with a material comprising silicon; selectively removing the metal residue with a plasma process comprising a halogen while covering the top surface of the patterned metal resist layer with the material comprising silicon; and patterning the layer to be patterned with a directional plasma etch process.

In accordance with an embodiment, a method for forming a semiconductor device includes depositing a metal resist layer over a layer to be patterned that is disposed over a substrate; patterning the metal resist layer using an extreme ultraviolet (EUV) lithography process to form a patterned metal resist layer so as to expose a first set of regions of the layer to be patterned; depositing a first material over the first set of regions; selectively removing the patterned metal resist layer to expose a second set of regions of the layer to be patterned; depositing a second material covering the second set of regions of the layer to be patterned, the second material being different from the first material; selectively removing the first material to re-expose the first set of regions of the layer to be patterned; performing a surface cleaning process by exposing the first set of regions of the layer to be patterned to a plasma process; and etching the first set of regions of the layer to be patterned to form a pattern in the layer to be patterned.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1E illustrate cross-sectional views of a semiconductor device during various stages of fabrication in accordance with an embodiment of the present application, wherein FIG. 1A illustrates a cross sectional view and a top view of the device after forming a patterned metal resist layer, FIG. 1B illustrates a cross sectional view of the device after depositing a protective silicon containing layer over the patterned metal resist layer forming an etch mask, FIG. 1C illustrates a cross sectional view of the device after a surface cleaning process, FIG. 1D illustrates a cross sectional view of the device after forming a pattern of device elements in the layer to be patterned, and FIG. 1E illustrates a cross sectional view of the device after removing the etch mask;

FIGS. 3A-3H illustrate cross-sectional views of a semiconductor device during various stages of fabrication in accordance with an embodiment of the present application, wherein FIG. 3A illustrates the device after forming a patterned metal resist layer, FIG. 3B illustrates the device after depositing a first material over exposed portions of a layer to be patterned, FIG. 3C illustrates the device after selectively removing the patterned metal resist layer, FIG. 3D illustrates the device after replacing the patterned resist layer with a second material, FIG. 3E illustrates the device after selectively removing the first material and forming an etch mask, FIG. 3F illustrates the device after a surface cleaning process, FIG. 3G illustrates the device after forming a pattern of device elements in the layer to be patterned, and FIG. 3H illustrates the device after removing the etch mask;

DETAILED DESCRIPTION OF ILLUSTRATIVE EMBODIMENTS

Figure 1A:
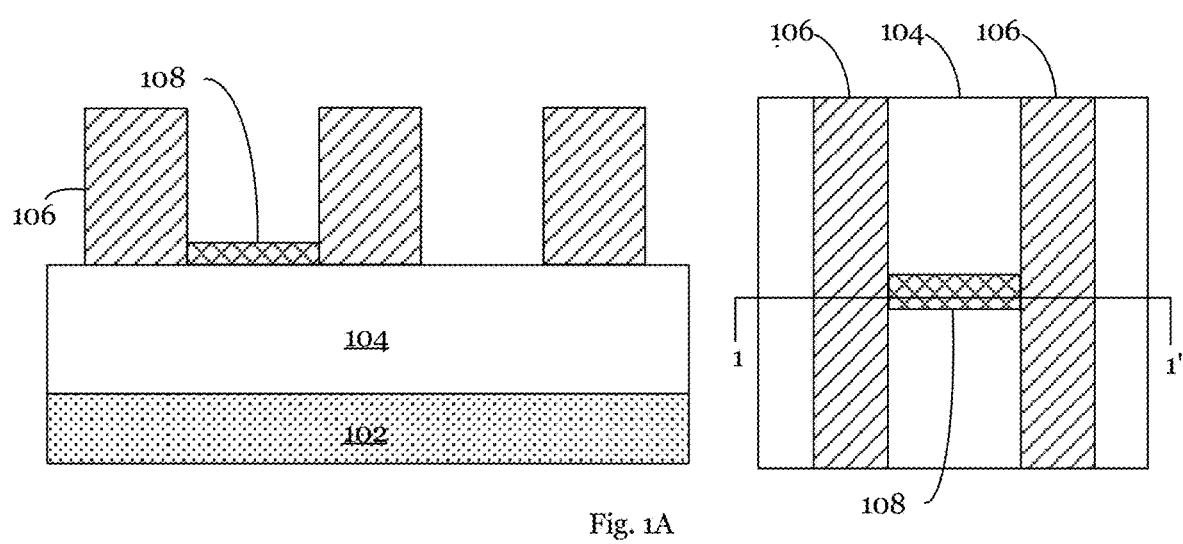

The present application relates generally to methods of forming patterned etch masks, and, in particular embodiments, to methods to remove defects from etch masks for forming nanometer scaled patterns.

As previously noted, chemically amplified (CA) resists are not able to meet the higher resolution of lower technology nodes. One issue with CA resists is that they are susceptible to known stochastic effects associated with the higher energy photons generated by the shorter extreme ultraviolet (EUV) wavelength. For example, the EUV photon has 14.3 times the energy of a 193 nm deep ultraviolet (DUV) photon, which results in a lower quantity of photons in a fixed exposure to define the edges of an exposed region. For example, a 1 $nm^2$ area of photoresist is exposed to an average of just 10 photons for a 15 $mJ/cm^2$ EUV exposure compared to 143 photons with a 193 nm DUV exposure of the same dose. Further, some regions randomly receive more or less photons than the average number of photons. Besides, when the scanner progresses from die to die across a wafer, the same region on every die may randomly receive different exposures. This is known as shot noise. Shot noise follows a Poisson distribution and results in exposure fluctuations that are many times larger than the exposure fluctuations in DUV. Also, as the size of a feature gets smaller, the impact of exposure fluctuations increases. The randomness of locations where photons interact with the resist causes blurring of the edge of an exposed region. Therefore, EUV resists must be designed to have a high sensitivity to protect against random exposures. Even though a CA resist can be designed to have a good sensitivity (S), as a CA resist sensitivity is improved, its resolution (R) and line-edge roughness are degraded and do not meet the requirements of the 10-nm node. This is known as the RLS-tradeoff.

Another issue with CA resists is the light-matter interaction in EUV. EUV uses high energy photons that generate photoelectrons which then generate secondary electrons when they interact with resist material. Unlike DUV, EUV photons do not expose resists by causing a chemical reaction in the resist, the secondary electrons formed by the EUV photons interacting with the resist expose the resist. The efficiency of a resist to form secondary electrons during EUV depends on the ability of the resist to absorb photons due to the smaller quantity of photons produced by the shorter EUV wavelength.

As understood by those with ordinary skill in the art, metal resists are able to overcome the shortcomings of CA resists and are able to provide an improved EUV photon absorption while mitigating stochastics, resulting in a better RLS trade-off than CA resists.

One disadvantage of metal resists is that they are prone to leave behind residual metal resist particles between device elements after the development step due to underexposed or underdeveloped resist. For example, the typical process flow for fabrication of semiconductor devices comprises multiple instances wherein a patterned resist layer is formed and used as an etch mask to transfer the pattern to underlying layers by selective etching of exposed underlying layers through the etch mask. Residual resist is problematic because it skews the profile of a patterned resist profile of the etch mask causing defects. For example, the residual resist may cover a portion of a target layer intended to be exposed in the patterned resist layer which may cause an undesired connection of two or more device elements in close proximity along with other possible defects. This is known as a bridging defect.

Embodiments described in this disclosure overcome the disadvantages of using metal resists by using a surface cleaning process after patterning a metallic resist layer to remove any remaining metal particles. Accordingly, one or more embodiments will be described using the cross-sectional FIGS. 1A-1F along with the flow chart of FIG. 2. Alternate embodiments will be described using the cross-sectional FIGS. 3A-3H along with the flow chart of FIG. 5.

Figure 1B:
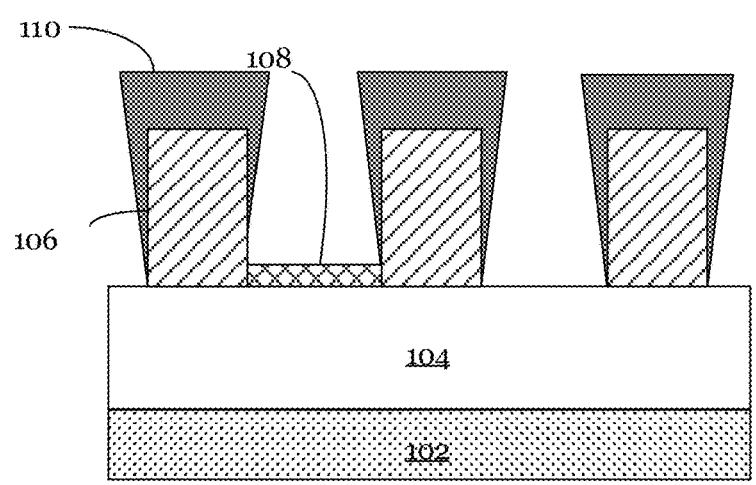
Figure 1C:
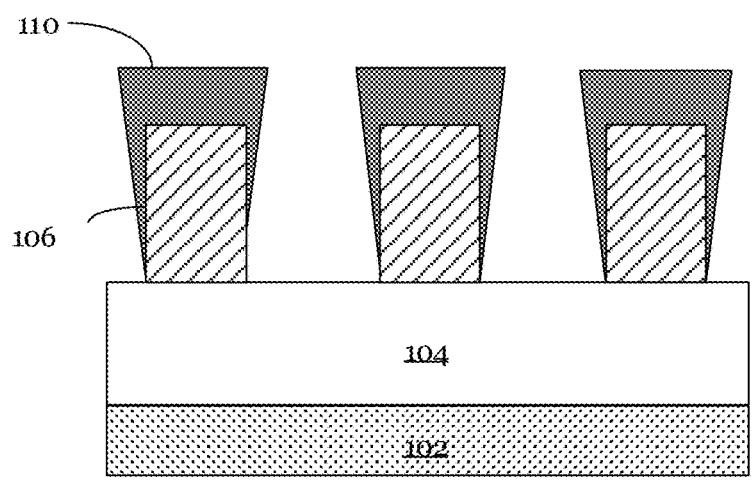
Figure 1D:
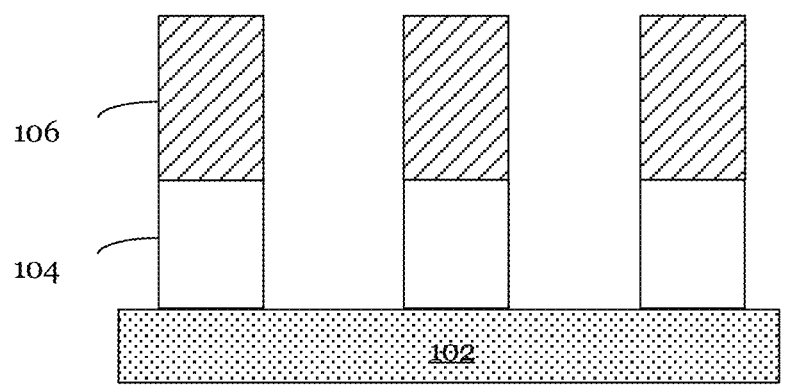

FIGS. 1A-1E illustrate views of a semiconductor device during various stages of fabrication in accordance with an embodiment of the present application. FIG. 1A illustrates a cross sectional view and a top view of the device after forming a patterned metal resist layer, FIG. 1B illustrates a cross sectional view of the device after depositing a silicon containing layer over the patterned metal resist layer forming an etch mask, FIG. 1C illustrates a cross sectional view of the device after a surface cleaning process, FIG. 1D illustrates a cross sectional view of the device after forming a pattern of device elements in the layer to be patterned, and FIG. 1E a cross sectional view of illustrates the device after removing the etch mask.

Referring to FIG. 1A, a patterned metal resist layer 106 is formed over a layer to be patterned 104 that is formed over a semiconductor substrate 102. The patterned metal resist layer 106 may be a pattern for device elements as known to a person having ordinary skill in the art. The patterned metal resist layer 106 exposes portions of the layer to be patterned 104.

The layer to be patterned 104 may be the layer that forms a device element or it may be an intervening layer that is used to subsequently form a device element. An example of such an intervening layer may be a hard mask layer that is used to subsequently pattern an element in an underlying layer. In various embodiments, the layer to be patterned 104 may be an insulating layer, a conductive layer, or a semiconductor layer depending on the feature being fabricated at this stage of fabrication. The layer to be patterned 104 may comprise films of dielectric and/or conductive materials, such as silicon oxide, silicon nitride, silicon oxynitride, silicon carbide, titanium nitride, tantalum nitride, their alloys, and combinations thereof. In some embodiments, the layer to be patterned 104 may be a sacrificial layer that is removed after being used as a hard mask in a subsequent etch step.

The semiconductor substrate 102 includes a semiconductor body for supporting the layer to be patterned 104 on which the patterned metal resist layer 106 is formed. The semiconductor body may be bulk substrate such as a bulk silicon substrate, a silicon-on-insulator substrate, a silicon carbide substrate, a gallium arsenide substrate, or hybrid substrates such as gallium nitride on silicon and other heteroepitaxial substrates, or any other configuration and material known by one with ordinary skill in the art. The semiconductor substrate 102 may include additional layer such as an intermetal dielectric (IMD) comprising a low-k dielectric material, an oxide, a nitride, and others. For example, the semiconductor substrate 102 may include multiple interconnect levels comprising dielectric films with embedded conductive interconnect elements formed over a single-crystal bulk semiconductor or semiconductor-on-insulator (SOI) wafer in which various active devices may be fabricated.

In various embodiments, the patterned metal resist layer 106 may be a sacrificial layer of a metal oxide photoresist film that is sensitive to EUV radiation in the wavelength range of 10 nm to about 14 nm, typically 13.5 nm. In one embodiment, the patterned metal resist layer 106 comprises an organometal oxide photoresist comprising an organometallic compound such as tin, hafnium, or zirconium, for example. The organometal oxide photoresist may be a positive tone resist or a negative tone resist.

To form the patterned metal resist layer 106, a metal resist layer is coated over the layer to be patterned 104, exposed to EUV radiation through a lithography mask, and developed to transfer a pattern of device elements from the lithography mask to the metal resist layer using, for example, 13.5 nm wavelength EUV lithography process steps known to those having ordinary skill in the art. In case of the organo metal resist, the patterned metal resist layer 106 thus formed is a metal oxide pattern.

This stage of processing may be performed at any stage of the device fabrication such as fin formation, gate formation, metal lines, contact plugs, vias, and so on. Although this process is described with reference to EUV lithography, lithography methods using longer wavelengths such as vacuum ultraviolet (VUV) radiation in the 100 nm to 200 nm range may be used.

As known to those having ordinary skill in the art, embodiments of the present invention contemplate the presence of other intervening layers. For example, an antireflective coating layer may be formed between the patterned metal resist layer 106 and the layer to be patterned 104 before forming patterned metal resist layer 106. The anti-reflection coating (ARC) film may comprise a silicon anti-reflection coating in one embodiment. In certain embodiments, the antireflective coating layer may comprise an organic ARC layer, a metal ARC layer, a metal oxide ARC layer, a titanium nitride ARC layer, or a spin on glass (SOG) layer. The antireflective coating layer is selected to be a material that avoids interaction between the patterned metal resist layer 106 and the underlying layer to be patterned 104.

In this embodiment, a post-development metal defect 108, such as a bridging defect, is formed on a portion of the upper surface of the layer to be patterned 104 due to underdeveloped or underexposed metal resist, as understood by those with ordinary skill in the art. The metal defect 108 may be formed on a portion of the layer to be patterned 104 intended to be exposed in the patterned metal resist layer 106, resulting in a defective etch mask with a skewed profile. The metal defect 108 may comprise residual metal resist or residual metal resist and the solvent used to develop the resist as well as other impurities. The metal defect 108 may be formed randomly across multiple locations over the layer to be patterned 104.

In addition, as illustrated in the associated top view on the right hand side of the page, the shape of the metal defect 108 may also be arbitrary, for example, the metal defect 108 may not extend all along the patterned metal resist layer 106. The line 1-1' corresponds to the cross-sectional view illustrated on the left side of the page.

Referring to FIG. 1B, a silicon containing layer 110 is selectively deposited over the patterned metal resist layer 106, forming a protective cap over the patterned metal resist layer 106 without capping the metal defect 108. The silicon containing layer 110 may fully or partially cover all of the sidewalls of the patterned metal resist layer 106. The silicon containing layer 110 may be selectively deposited over the patterned metal resist layer 106 by exposing the patterned metal resist layer 106 to a gas mixture comprising a silicon precursor and one or more inert gasses such as helium, argon, and nitrogen through a shower head in a dedicated deposition tool or plasma etch chamber, as understood by those with ordinary skill in the art.

The thickness of the silicon containing layer 110 is selected so as to be able to protect the underlying patterned metal resist layer 106 during the subsequent surface clean process that is used to remove the metal defect 108. As understood by those with ordinary skill in the art, the portions of the silicon containing layer 110 protecting the top surface and sidewalls of the patterned metal resist layer 106 may be (partially) consumed during the subsequent surface cleaning process by ion sputtering. Advantageously, the thickness of the silicon containing layer 110 is selected to be deposited with a thickness in the range of 2-5 nm over the top surface of the patterned metal resist layer 106 and a range of 1-2 nm over the sidewalls of the patterned metal resist layer 106 in order to ensure the silicon contain layer 110 remains over the patterned metal resist layer 106 after the surface cleaning process.

Embodiments of the application include the use of a cyclic process to form the silicon containing layer 110. Advantageously, this may be used to tune the thickness profile of the silicon containing layer 110 deposited over the patterned metal resist layer 106. For example, cycles of deposition and trim process may be performed to form the silicon containing layer 110. In one example, after depositing a layer(s) of the silicon containing layer 110, the silicon containing layer 110 may be trimmed using, for example, isotropic plasma etch processing, gas phase etching, or wet etching. The trimming may remove any of the material of the silicon containing layer 110 deposited in the trenches between adjacent patterned metal resist layer 106 (over the metal defect 108). Alternately, an optional trim process may be performed at the end of the deposition process that forms the silicon containing layer 110 to remove any silicon containing layer 110 covering the metal defect 108. If the metal defect 108 stays covered, the subsequent surface clean process will have difficulty in removing the metal defect 108 unless it also etches part of the silicon containing layer 110.

In one embodiment, the silicon containing layer 110 comprises a silicon oxide layer deposited using chemical vapor deposition (CVD), for example, wherein the gas mixture may comprise a silicon precursor such as silicon tetrachloride, oxygen, and one or more carrier gases. The silicon precursor such as silicon tetrachloride selectively reacts with the oxygen along the surfaces of the patterned metal resist layer 106 and forms silicon oxide, which is then selectively deposited on exposed top surface and sidewalls of the patterned metal resist layer 106.

In another embodiment, the silicon containing layer 110 comprises silicon deposited using a plasma process such as plasma enhanced chemical vapor deposition (PECVD), for example, wherein the gas mixture may comprise a silicon precursor such as dichloro silane ($SiCl_2H_2$), silane, or tetraethoxysilane (TEOS), for example, a additive gas such as $O_2$ or $H_2$, for example, and one or more carrier gases. Alternately, the gas mixture may comprise silicon tetrachloride and hydrogen. Other silicon containing gases such as silicon tetrafluoride may also be used. Similar to the prior embodiment, the reaction is selective to the exposed surfaces of the patterned metal resist layer 106 and a layer of silicon is deposited on the exposed top surface and sidewalls of the patterned metal resist layer 106. The layer of silicon is a material made substantially of silicon so that at least 90% of the silicon containing layer 110 is silicon. The layer of silicon may be a layer of elemental silicon in one embodiment. The layer of silicon may be amorphous silicon or polycrystalline silicon in different embodiments. Although the deposited material is substantially silicon, a portion thereof may become oxidized into silicon dioxide by exposure to oxygen (e.g., exposure to air).

Advantageously, as illustrated in FIG. 1B, the silicon containing layer 110 is selectively deposited on the top surface and sidewalls of the patterned metal resist layer 106. One advantage of selectively depositing the silicon containing layer 110 on the top surface and sidewalls of the patterned metal resist layer 106 is that the silicon containing layer 110 provides a protective cap over the patterned metal resist layer 106 without covering the metal defect 108 during the subsequent surface cleaning process.

Referring to FIG. 1C, the metal defect 108 is removed using a surface cleaning process by exposing the layer to be patterned 104 and the patterned metal resist layer 106 covered with the silicon containing layer 110 to a plasma process so as to form a non-defective etch mask. The surface cleaning plasma process gases are selected to be reductive and may comprise a halogen or a hydrogen chemistry, for example. In one embodiment, the surface cleaning plasma process gases may comprise chlorine or bromine, and hydrogen along with an inert gas such as argon. This is because chlorine and bromine can selectively remove metal particles without etching the silicon containing layer 110. In the absence of the silicon containing layer 110, chlorine/bromine will also etch the underlying patterned metal resist layer 106.

In one embodiment, one halogen or hydrogen chemistry is selected to remove all of the metal defect 108 without etching the underlying layer to be patterned 104. For example, the hydrogen or halogen chemistry may comprise $BCl_3$, HBr, $CH_4$ or $H_2$, for example. In some embodiments, the surface cleaning plasma processes gasses may also include a diluent gas such as Ar, Kr, or He, for example.

In one embodiment, the flow rate of the surface cleaning process gasses may be about 10 sccm to about 300 sccm. In other embodiments, the diluent gas flow rate may be about 500 sccm to about 1000 sccm. In one embodiment, the surface cleaning process pressure may be about 10 mT to 100 mT. The plasma source power may range from about 50 W to about 500 W, and bias power may range from about 0 W to 100 W. Embodiments contemplate different ways to determine whether the surface cleaning process is within the target process window. These include confirming a reduction of bridging defects using a defect inspection process either after the surface cleaning process or after etching the layer to be patterned 104 in a subsequent step, or electrical parametric tests later in the fabrication of the device to confirm improved yields.

In various embodiments, the surface cleaning plasma process may be performed in the same tool used to form the silicon containing layer 110 described in FIG. 1B above.

As understood by those with ordinary skill in art, gas-phase halogen plasmas are highly selective to silicon oxide. Therefore, in an embodiment where the silicon containing layer 110 comprises silicon oxide, the majority of the silicon containing layer 110 remains over the metallic patterned resist layer 106 after the surface cleaning process with zero to minimal losses of the silicon containing layer 110 due to ion sputtering, as described above.

In other embodiments, the surface cleaning process may not be as selective to the silicon containing layer 110, for example, when the silicon containing layer 110 is made of substantially silicon, e.g., elemental silicon, so the silicon containing layer 110 may be a sacrificial layer so that subsequent etching is performed using primarily the patterned metal resist layer 106.

Advantageously, in one embodiment, the metal defect 108 is removed using a surface cleaning process immediately after forming the patterned metal resist layer 106 and the silicon containing layer 110. One advantage of removing the metal defect 108 using a surface cleaning process immediately after forming the patterned metal resist layer 106 and the silicon containing layer 110 is that it may reduce the number of underlying layers required for semiconductor fabrication, resulting in a reduced processing time and a reduced processing cost.

Referring to FIG. 1D, using the patterned metal resist layer 106 covered by the silicon containing layer 110 as an etch mask, the pattern of device elements are formed in the layer to be patterned 104 by exposing the layer to be patterned 104 to a directional etch process through the etch mask.

As illustrated in FIG. 1D, the directional etch process may not be selective to the silicon containing layer 110, and hence may be removed during the etching. In an embodiment, where the silicon containing layer 110 comprises silicon oxide, the directional etch process may be performed in an inductively coupled plasma (ICP) processing system or a capacitively coupled plasma (CCP) processing system known by those with ordinary skill in the art.

In another embodiment, where the silicon containing layer 110 comprises a material made substantially of silicon, the plasma etching process may performed in a CCP processing system known by those with ordinary skill in the art.

Figure 1E:
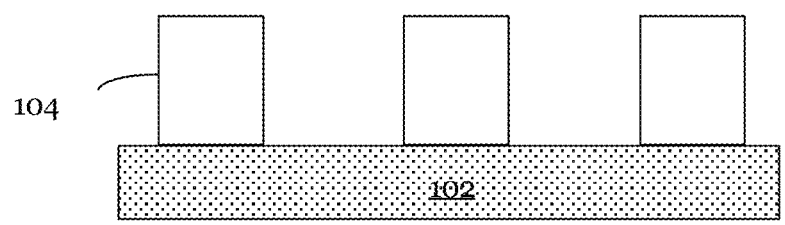

Referring to FIG. 1E, the patterned metal resist layer 106 and any remaining silicon containing layer 110 are selectively removed. A plasma etch process comprising a halogen or hydrogen chemistry similar to the halogen or hydrogen chemistry used in the surface cleaning process, for example, may be used to remove the patterned metal resist layer 106 once the remaining silicon containing layer 110 is removed as described in FIG. 1D.

Figure 2:
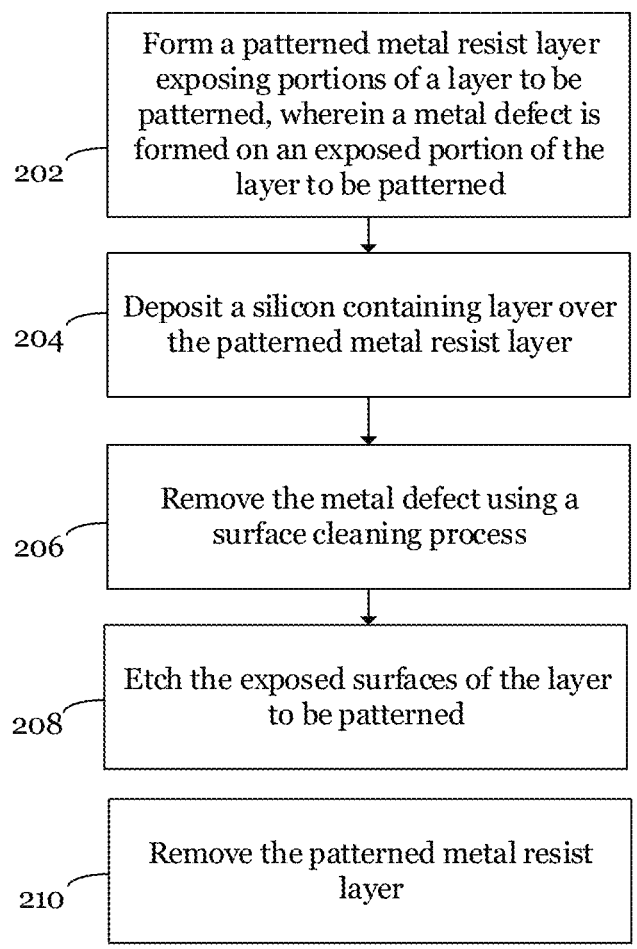
FIG. 2 is a flow chart illustrating an example process flow of a surface cleaning process used to remove residual resist from an etch mask in accordance with an embodiment of the present application.

FIG. 2 is a flow chart illustrating an example process flow of a surface cleaning process used to remove residual resist from an etch mask in accordance with an embodiment of the present application.

As illustrated in block 202 and described with reference to FIG. 1A, a patterned metal resist layer 106 is formed over a layer to be patterned 104 that is formed over a semiconductor substrate 102. As described above, a metal defect 108 is formed on an upper surface of the layer to be patterned 104 between patterned portions of the patterned metal resist layer 106, covering a portion of the layer to be patterned 104 intended to be exposed through the patterned metal resist layer 106.

As next illustrated in block 204 and described with reference to FIG. 1B, a silicon containing layer 110 is formed by selectively depositing a material comprising silicon using a selective deposition process. The selective deposition process may comprise a CVD process or a plasma deposition process. The silicon containing layer 110 may comprise a layer of silicon oxide or a layer made substantially of silicon atoms and may be formed in the same manner described and illustrated in FIG. 1B.

As mentioned above, the silicon containing layer 110 advantageously forms a protective cap over the patterned metal resist layer 106 to provide protection during a subsequent surface cleaning step to remove the metal defect 108.

As next illustrated in block 206 and described with reference to FIG. 1C, the metal defect 108 is removed using a surface cleaning process by exposing the layer to be patterned 104 and the patterned metal resist layer 106 covered with the silicon containing layer 110 to a plasma process. The surface cleaning plasma may comprise the same material and may be formed in the same manner described in FIG. 1C.

As explained above, the surface cleaning process removes the metal defect 108 while the silicon containing layer 110 protects the patterned metal resist layer 106, thus forming a non-defective etch mask with an improved horizontal profile. In this embodiment, the surface cleaning process is highly selective to the silicon containing layer 110 and the non-defective etch mask comprises the patterned metal resist layer 106 covered by the silicon containing layer 110 in the same manner described and illustrated in FIG. 1C. In other embodiments, the surface cleaning process may not have selectivity to the silicon containing layer 110 so it is a sacrificial layer and the non-defective etch mask comprises only the patterned metal resist layer 106.

As mentioned above, one advantage of removing the metal defect 108 using a surface cleaning process immediately after developing the patterned metal resist layer 106 and the silicon containing layer 110 is that it may reduce the number of underlying layers required for semiconductor fabrication, resulting in a reduced process time and a reduced process cost.

As next illustrated in block 208 and described with reference to FIG. 1D, using the patterned metal resist layer 106 covered by the silicon containing layer 110 as an etch mask, the layer to be patterned 104 is patterned using a directional etch process. As described above, the directional etch process may also remove the silicon containing layer 110 because the directional etch process may not be selective to the silicon containing layer 110. The directional etch process may comprise an inductively coupled plasma or a capacitively coupled plasma in the same manner described in FIG. 1D. In other embodiments wherein the silicon containing layer 110 is a sacrificial layer, the layer to be patterned 104 is patterned by exposing the layer to be patterned 104 to a directional etch through an etch mask comprising only the patterned metal patterned resist layer 106 using a capacitively coupled plasma.

As next illustrated in block 210 and described with reference to FIG. 1E, the metal patterned resist layer 106 is removed using a plasma etching process with similar etching chemistry as used in block 206.

Figure 3A:
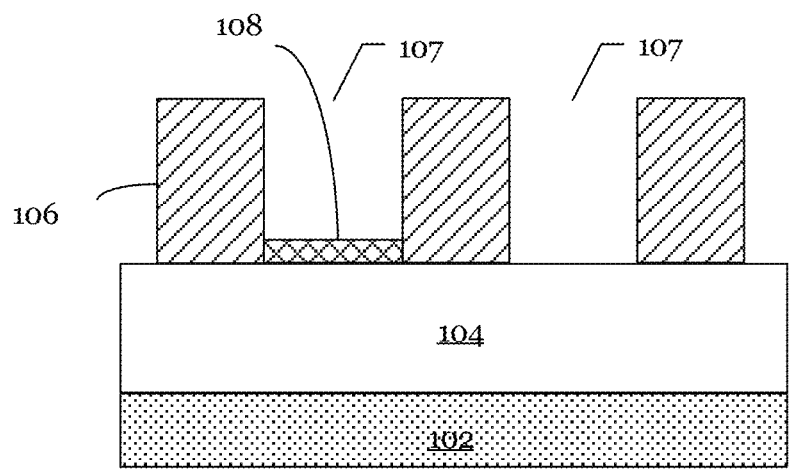
Figure 3B:
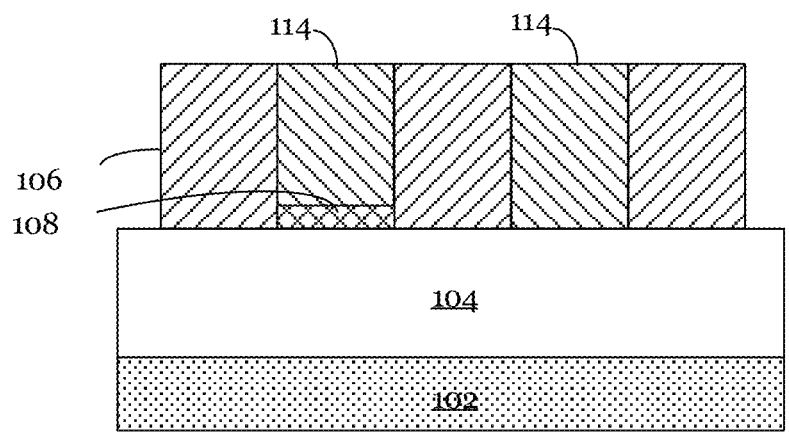
Figure 3C:
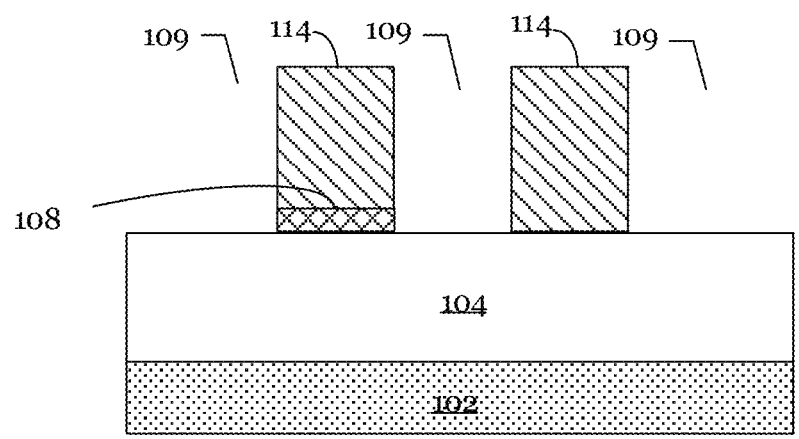
Figure 3D:
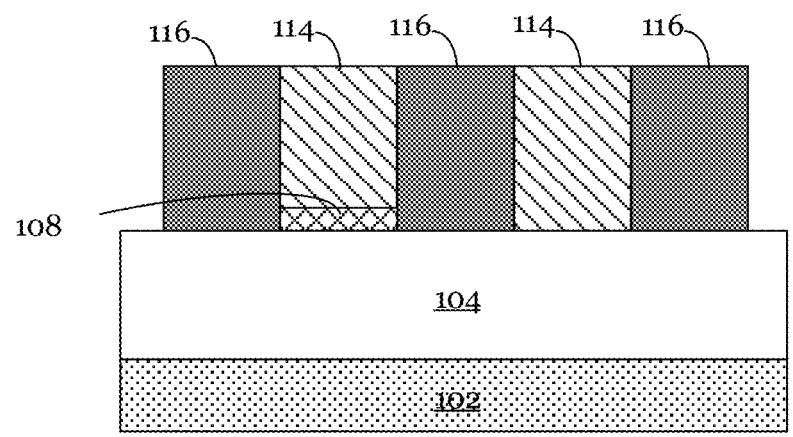
Figure 3E:
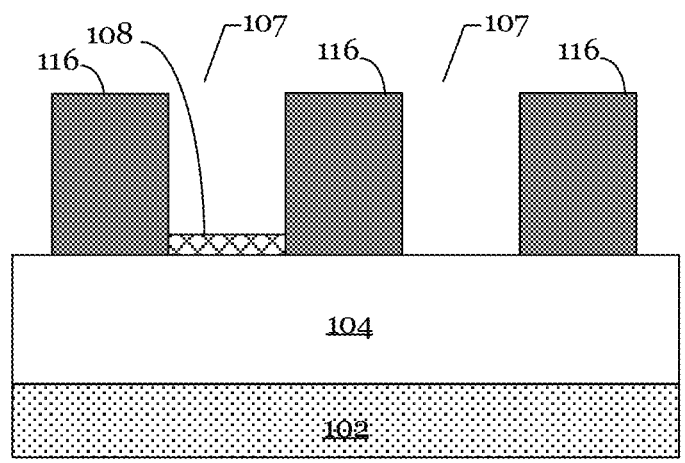
Figure 3F:
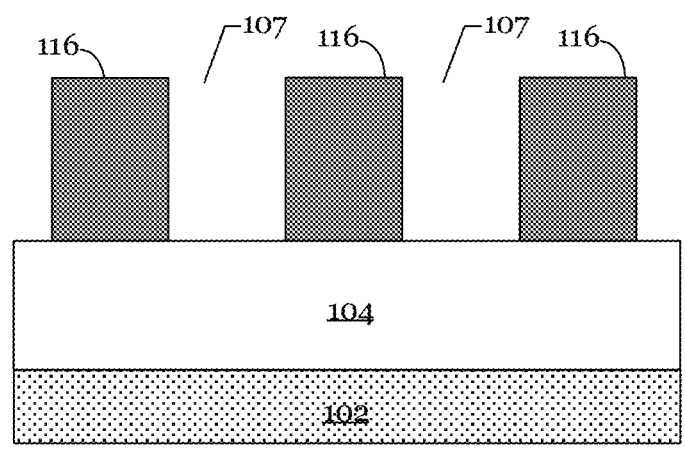
Figure 3G:
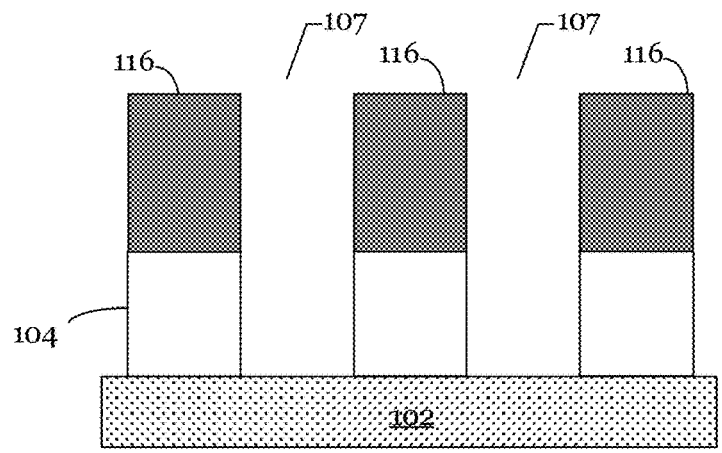
Figure 3H:
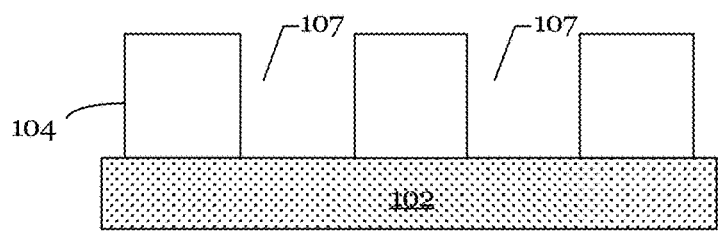

FIGS. 3A-3H illustrate cross-sectional views of a semiconductor device during various stages of fabrication in accordance with an embodiment of the present application, wherein FIG. 3A illustrates the device after forming a patterned metal resist layer, FIG. 3B illustrates the device after depositing a first material over exposed portions of a layer to be patterned, FIG. 3C illustrates the device after selectively removing the patterned metal resist layer, FIG. 3D illustrates the device after replacing the patterned resist layer with a second material, FIG. 3E illustrates the device after selectively removing the first material and forming an etch mask, FIG. 3F illustrates the device after a surface cleaning process, FIG. 3G illustrates the device after forming a pattern of device elements in the layer to be patterned, and FIG. 3H illustrates the device after removing the etch mask.

Referring to FIG. 3A, a metal patterned resist layer 106 is formed over a layer to be patterned 104 that is formed over a semiconductor substrate 102. The patterned metal resist layer 106 may comprise the same material and may be formed in the same manner described in FIG. 1A, wherein the patterned metal resist layer 106 comprises a pattern of device elements having a first set of regions 107 of the layer to be patterned 104 exposed through the patterned metal resist layer 106. Similarly, the layer to be patterned 104 and the semiconductor substrate 102 may comprise the same material and may be formed in the same manner described in FIG. 1A.

As explained above, embodiments of the present invention contemplate the presence of other intervening layers known to those having ordinary skill in the art, in the same manner described in FIG. 1A.

In this embodiment, after the patterned metal resist layer 106 is developed, a metal defect 108, such as a bridging defect, comprising residual organometal is formed over a region of the first set of regions 107 of the layer to be patterned 104, resulting in a defective etch mask with a skewed profile as described in FIG. 1A. The metal defect 108 may comprise the same material and be may be formed in the same manner described and illustrated in FIG. 1A.

Referring to FIG. 3B, a first material 114 is selectively deposited over the first set of regions 107 of the layer to be patterned 104, covering the first set of regions. The first material 114 may comprise a silicon based material such as silicon oxide, for example.

In various embodiments, the patterned metal resist layer 106 is intended to be removed and replaced with a different material forming a patterned etch mask in subsequent steps. Advantageously, the first material 114 is selected to have a higher etch selectivity than the patterned metal resist layer 106 to the etching process used, ensuring that the pattern metal resist layer 106 is removed while the first material remains in place, preserving the original pattern of device elements.

In one embodiment, the first material 114 may be deposited over the first set of regions 107 of the layer to be patterned 104 by exposing the layer to be patterned 104 to a gas mixture comprising a silicon precursor and one or more inert carrier gasses such as helium, argon, and nitrogen. The silicon containing layer 110 may be formed in a dedicated deposition tool or plasma etch chamber. In one embodiment, the first material 114 comprises silicon oxide deposited using chemical vapor deposition (CVD), for example, wherein the gas mixture may comprise a silicon precursor such as silicon tetrachloride, oxygen, and one or more carrier gases. Other silicon precursor gasses such as silicon tetrafluoride may also be used. In other embodiments the first material 114 may be deposited using a plasma deposition process such as PECVD, for example. The deposition process usually overfills the trenches between adjacent patterned metal resist layer 106.

After the deposition, the first material 114 is planarized, for example, using a chemical mechanical planarization to remove the overfill. In various embodiments, as understood by those with ordinary skill in the art, a chemical-mechanical polishing (CMP) process may be used after depositing the first material 114 to ensure that the metal patterned resist layer 106 and the first material 114 have a uniform film thickness (with minimal variation) across the layer to be patterned 104.

Referring to FIG. 3C, the patterned metal resist layer 106 is selectively removed, exposing a second set of regions 109 of the layer to be patterned 104. The patterned metal resist layer 106 may be selectively removed using a dry plasma etching process comprising a gas-phase etchant such as $BCl_3$, HBr, or hydrogen. In various embodiments, the dry etching plasma may be formed in the same tool as the first material 114 described in FIG. 3B above.

Referring to FIG. 3D, the newly exposed second set of regions 109 of the layer to be patterned 104 are covered by a second material 116 such that the patterned metal resist layer 106 is replaced by the second material 116. The second material 116 may comprise silicon and is a different material than the first material 114. In this embodiment, the second material 116 may comprise silicon nitride, silicon oxynitride for example. The second material 116 may be deposited using a plasma deposition process such as a PECVD process, for example, wherein the process gas mixture may comprise a silicon precursor such as silane and ammonia or nitrogen. In various embodiments, the second material may be formed and deposited in the same deposition tool as the first material 114 described in FIG. 3B above. In various embodiments, as understood by those with ordinary skill in the art, after depositing the second material 116, a CMP process may be used to ensure that the first material 114 and the second material 116 have a uniform film thickness with less variation across the layer to be patterned 104.

As explained above, the pattern of device elements formed as the second material 116 is intended to be used as an etch mask to transfer the pattern of device elements to the layer to be patterned 104 in a subsequent step.

Advantageously, in the same manner discussed above, the second material 116 is selected to have a higher etch selectivity than the first material 114 to the etching process used. One advantage of the second material 116 having a higher etch selectivity to the etching process than the first material 114 is that it ensures that the first material 114 is selectively removed, forming an etch mask comprising the same pattern of device elements previously formed in the patterned metal resist layer 106.

Referring to FIG. 3E, the first material 114 is selectively etched, re-exposing the first set of regions 107 of the layer to be patterned 104 and the metal defect 108, by exposing the substrate to a first plasma. The first plasma may be generated in a plasma process with process gasses that may include a fluorocarbon such as $C_4F_8$, for example, oxygen, and one or more carrier gasses including helium, argon, and nitrogen. In other embodiments, fluorocarbons such as $C_3F_8$ or $C_4F_6$, may also be used.

As mentioned above, the second material 116 is etched at a significantly slower rate than the first material 114 when exposed to the first plasma, allowing for the first material 114 to be selectively removed, forming an etch mask comprising the second material 116.

Referring to FIG. 3F, the metal defect 108 is selectively removed using a surface cleaning process by exposing the re-exposed first set of regions 107 to the layer to be patterned 104 to a second plasma, forming a non-defective etch mask (i.e., the etch mask without the metal defect 108). The second plasma may be generated in a plasma process with process gasses such as $BCl_3$, HBr, or $H_2$, for example.

Referring to FIG. 3G, using the etch mask comprising the second material 116, the first set of regions 107 of the layer to be patterned 104 (i.e. the pattern of device elements) are etched into the layer to be patterned 104 by exposing the layer to be patterned 104 through the second material 116 using a third plasma. The third plasma may be generated in a plasma process with process gasses that may include a fluorocarbon such as $C_4F_8$, for example, oxygen, and one or more carrier gasses including helium, argon, and nitrogen. Other fluorocarbons such as $C_3F_8$, $C_4F_6$ may also be used. In various embodiments, the first plasma, the second plasma, and the third plasma may all formed in the same plasma processing tool.

In various embodiments, selectively removing the first material 114, the surface cleaning process, and etching the first set of regions in the layer to be patterned 104 are all performed sequentially in a single common etching process in the single plasma etching chamber or a single dedicated tool.

Figure 4:
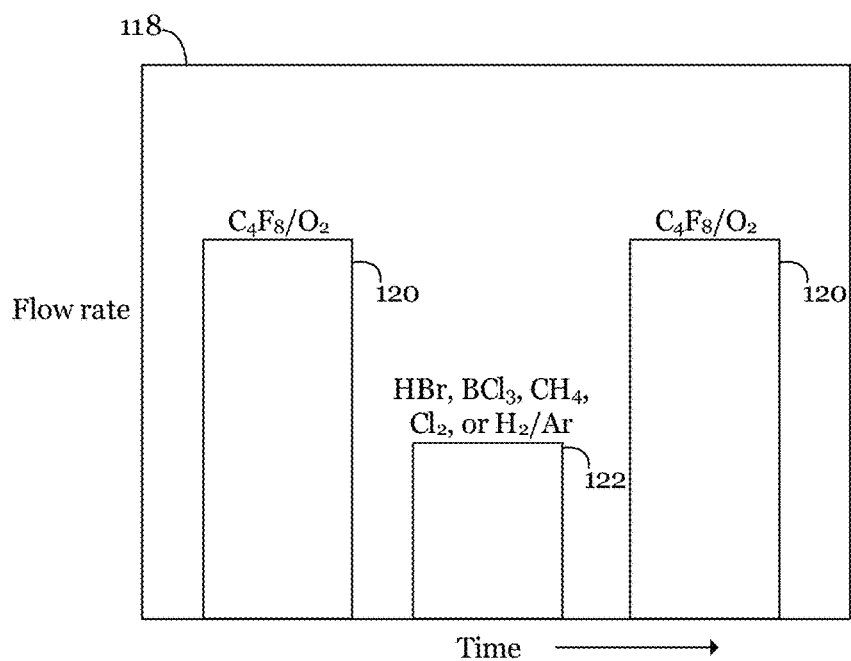
FIG. 4 is a graph illustrating a set of process parameters for performing a surface cleaning process and forming a pattern of device elements in the layer to be patterned using a single common etch process.

FIG. 4 illustrates a graph 118 describing the process flow and parameters of such a single common etching process recipe. Referring to FIG. 4 and as illustrated in the cross-sectional views of FIGS. 3D-3E, the first plasma is generated from a first set of process gasses 120 comprising a fluorocarbon such as $C_4F_8$, for example, oxygen, and a carrier gas such as argon in order to remove the first material 114. The semiconductor substrate 102 of FIG. 3D is exposed to the first set of process gasses 120 for a first predetermined amount of time at a first flow rate, a first RF source power, and a first bias power. The first predetermined amount of time may be selected from a range of times between 10 and 60 s, the first flow rate may be selected from a range of flow rates between 100 and 500 sccm, the first RF source power may be selected from a range of 100 and 800 W, and the first bias power may be selected from a range of 100 and 500 W. In other embodiments, a chemical oxide removal (COR) process, using a separate etch chamber, may be used to remove the first material 114.

After exposing to the first set of process gasses 120, as illustrated in the cross-sectional views of FIGS. 3E-3F, a second plasma is generated from a second set of process gasses 122 comprising an etching gas such as $BCL_3$, or $H_2$, or $CH_4$, or HBr, for example, and a carrier gas such as argon in order to remove the metal defect 108. The semiconductor substrate 102 of FIG. 3E is exposed to the second set of process gasses 122 for a second predetermined amount of time at a second flow rate. In some embodiments the second predetermined amount of time and the second flow rate may be less than the first predetermined amount of time and the first flow rate. The second predetermined amount of time may be selected from a range of times between 2 and 10 s, and the second flow rate may be selected from a range of flow rates between 10 and 200 sccm for etching gas, and a range of flow rates between 200 and 1000 sccm for carrier gas.

After exposure to the second set of process gasses 122, as illustrated in the cross-sectional views of FIGS. 3F-3G, the semiconductor substrate 102 is again exposed to the first set of process gasses 120 in order to etch the first set of regions 107 into the layer to be patterned 104. The semiconductor substrate 102 is re-exposed to the first set of process gasses 120 to etch through the layer to be patterned 104. The etch process time may be selected based on the thickness of the layer to be patterned 104. For example, if the layer to be patterned 104 has a thickness of 20 nm, an etch process time selected from a range between 10 and 60 s may be used.

Referring to FIG. 3H, the etch mask comprising the second material 116 is selectively removed. As known by those with ordinary skill in the art, a plasma etching process, for example, may be used to remove the etch mask.

Figure 5:
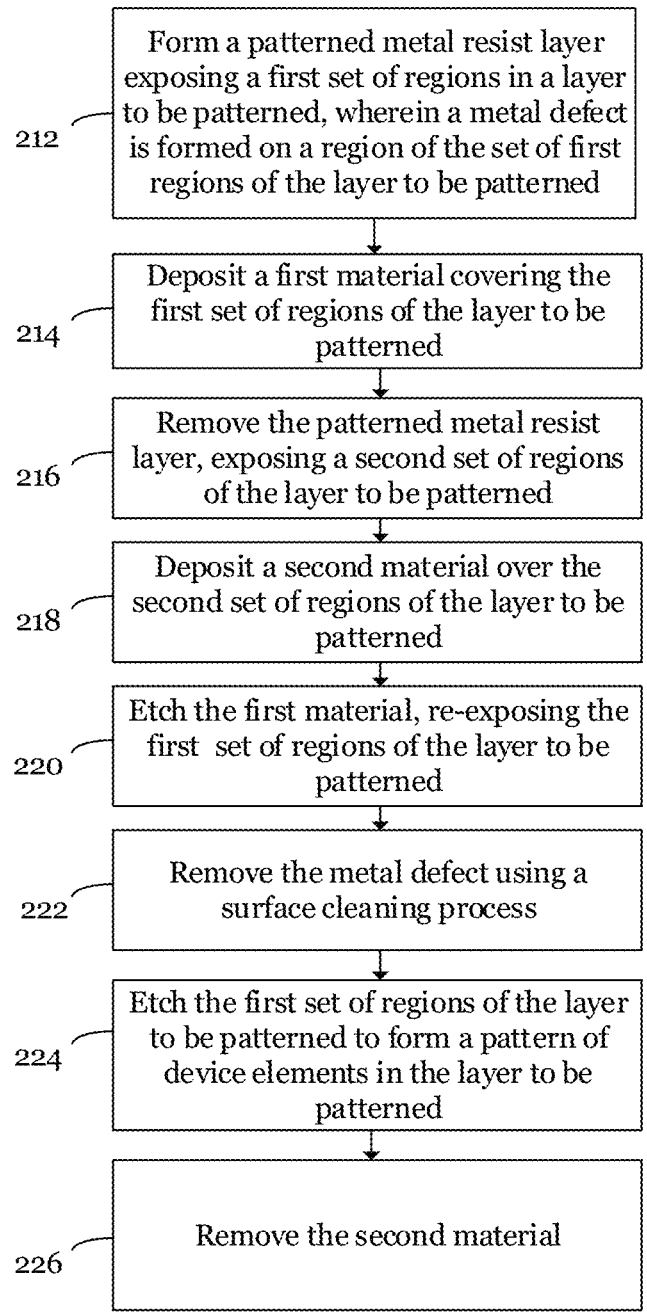
FIG. 5 is a flow chart illustrating an example process flow of a surface cleaning process of a layer to be patterned in order to remove residual resist from an etch mask in accordance with an alternative embodiment of the present application.

FIG. 5 is a flow chart illustrating an example process flow of a surface cleaning process of a layer to be patterned in order to remove residual resist from an etch mask in accordance with an alternative embodiment of the present application.

As illustrated in block 212 and described with reference to FIG. 3A, a patterned metal resist layer 106 is formed over a layer to be patterned 104 that is formed over a semiconductor substrate 102. As described above, a metal defect 108, such as a bridging defect, comprising residual resist is formed over a region of the first set of regions 107 of the layer to be patterned 104, resulting in a defective etch mask with a skewed profile. The metal defect 108, the patterned metal resist layer 106, the layer to be patterned 104, and the semiconductor substrate 102 may comprise the same material and may be formed in the same manner described and illustrated in prior embodiments.

As next illustrated in block 214 and described with reference to FIG. 3B, the first material 114 is selectively deposited over the first set of regions 107 of the layer to be patterned 104.

As next illustrated in block 216 and described with reference to FIG. 3C, the patterned metal resist layer 106 is selectively removed exposing a second set of regions 109 of the layer to be patterned 104. The patterned metal resist layer 106 may be selectively removed using a dry plasma etching process. The dry plasma etching process may be formed in the same manner described in FIG. 3C.

As next illustrated in block 218 and described with reference to FIG. 3D, a second material 116 is selectively deposited over the second set of regions 109 of the layer to be patterned 104.

As next illustrated in block 220 and described with reference to FIG. 3E, the first material 114 is selectively removed using a first plasma, re-exposing the first set of regions 107 of the layer to be patterned 104. The first plasma may be formed in the same manner described in FIG. 3E.

As next illustrated in block 222 and described with reference to FIG. 3F, the metal defect 108 is selectively removed using a second plasma, forming a non-defective etch mask with an improved horizontal profile. The second plasma may be formed in the same manner described in FIG. 3F.

As next illustrated in block 224 and described with reference to FIG. 3G, using the second material 116 as an etch mask, the re-exposed first set of regions 107 of the layer to be patterned 104 (i.e. the pattern of device elements) are etched into the layer to be patterned 104 via a third plasma. The third plasma may be formed in the same manner described in FIG. 3G.

As explained above, the steps described in blocks 220, 222, and 224 may be formed in the same tool and may be performed sequentially using a single etch recipe in the same manner described in FIG. 4.

As next illustrated in block 226 and described in reference to FIG. 3H, the second material 116 is removed using a plasma etching process known by those with ordinary skill in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device, the method comprising:

depositing a metal resist layer over a layer to be patterned that is formed over a substrate;

patterning the metal resist layer using a lithography process to form a patterned metal resist layer and expose portions of the layer to be patterned;

selectively depositing a masking layer over the patterned metal resist layer by exposing the substrate to a gas mixture; and performing a surface cleaning process by exposing the layer to be patterned and the patterned metal resist layer covered with the masking layer to a plasma process.

2. The method of claim 1, further comprising patterning, with an etch mask comprising the patterned metal resist layer covered with the masking layer, the layer to be patterned by exposing the layer to be patterned to a directional etch process.

3. The method of claim 1, wherein patterning the metal resist layer comprises forming a metal defect over one of the exposed portions of the layer to be patterned, and wherein the surface cleaning process removes the metal defect.

4. The method of claim 1, wherein the gas mixture comprises a silicon precursor comprising silicon tetrachloride, and wherein the masking layer comprises silicon oxide.

5. The method of claim 4, further comprising patterning the layer to be patterned by exposing the layer to be patterned covered with an etch mask comprising the patterned metal resist layer covered with the masking layer to an inductively coupled plasma or a capacitively coupled plasma.

6. The method of claim 4, wherein the silicon precursor comprises dichloro silane, and wherein the masking layer comprises a layer of silicon.

7. The method of claim 6, further comprising patterning the layer to be patterned by exposing the layer to be patterned covered with an etch mask comprising the patterned metal resist layer covered with the masking layer to a capacitively coupled plasma.

8. The method of claim 1, wherein the metal resist layer further comprises a metal oxide extreme ultraviolet (EUV) resist, and wherein forming the patterned metal resist layer further comprises:

exposing the metal resist layer to an EUV light beam; and developing the metal resist layer after exposing to form the patterned metal resist layer.

9. The method of claim 1, wherein the masking layer is selectively deposited on a top surface and sidewalls of the patterned metal resist layer.

10. The method of claim 1, wherein the plasma process comprises an etch chemistry comprising $BCl_3$, $HBr$, $H_2$, or $CH_4$.

11. A method for forming a semiconductor device, the method comprising:

depositing a metal resist layer over a layer to be patterned that is disposed over a substrate;

patterning the metal resist layer using an extreme ultraviolet (EUV) lithography process to form a patterned metal resist layer and expose portions of the layer to be patterned, wherein the patterning leaves a metal residue over one of the exposed portions of the layer to be patterned;

covering a top surface of the patterned metal resist layer with a masking material;

selectively removing the metal residue with a plasma process while covering the top surface of the patterned metal resist layer with the masking material; and patterning the layer to be patterned with a directional plasma etch process.

12. The method of claim 11, wherein the masking material is selectively deposited on the top surface and sidewalls of the patterned metal resist layer.

13. The method of claim 11, wherein covering the top surface of the patterned metal resist layer with the masking material comprises performing a chemical vapor deposition process to deposit a silicon oxide layer.

14. The method of claim 13, wherein performing the chemical vapor deposition process comprises flowing silicon tetrachloride and oxygen into a deposition chamber to selectively deposit the silicon oxide layer on the patterned metal resist layer.

15. The method of claim 11, wherein covering the top surface of the patterned metal resist layer with the masking material comprises performing a plasma deposition process to deposit a layer of silicon, wherein performing the plasma deposition process comprises generating a plasma from a gaseous mixture comprising dichloro silane.

16. A method for forming a semiconductor device, the method comprising:
performing an extreme ultraviolet (EUV) lithography process to form a patterned metal resist layer over a layer to be patterned and expose portions of the layer to be patterned, wherein the patterning leaves a metallic defect over one of the exposed portions of the layer to be patterned;
performing a deposition process to form a masking material over the patterned metal resist layer and the layer to be patterned;
performing a trim process to expose the metallic defect;
selective etching the metallic defect to expose all of the portions of the layer to be patterned; and
patterning the layer to be patterned using the patterned metal resist layer as an etch mask.

17. The method of claim 16, further comprising repeating the deposition process and the trim process, wherein the deposition process and the trim process are part of a cyclic process.

18. The method of claim 16, wherein performing the deposition process comprises performing a chemical vapor deposition process to deposit a silicon oxide layer.

19. The method of claim 18, wherein performing the chemical vapor deposition process comprises flowing silicon tetrachloride and oxygen into a deposition chamber to selectively deposit the silicon oxide layer on the patterned metal resist layer.

20. The method of claim 16, wherein performing the deposition process comprises performing a plasma deposition process to deposit a layer of silicon, wherein performing the plasma deposition process comprises generating a plasma from a gaseous mixture comprising dichloro silane.

* * * * *